(12) United States Patent
Miller

(10) Patent No.: US 9,557,365 B2
(45) Date of Patent: Jan. 31, 2017

(54) APPARATUSES, SYSTEMS AND METHODS FOR DETECTING CORONA

(71) Applicant: Hubbell Incorporated, Shelton, CT (US)

(72) Inventor: Gary Michael Miller, Kearneysville, WV (US)

(73) Assignee: Hubbell Incorporated, Shelton, CT (US)

( * ) Notice: Subject to any disclaimer, the term of this patent is extended or adjusted under 35 U.S.C. 154(b) by 172 days.

(21) Appl. No.: 14/202,940

(22) Filed: Mar. 10, 2014

(65) Prior Publication Data

US 2014/0270205 A1    Sep. 18, 2014

Related U.S. Application Data

(60) Provisional application No. 61/781,496, filed on Mar. 14, 2013.

(51) Int. Cl.
*H04R 29/00* (2006.01)
*G01R 31/14* (2006.01)
*G01R 31/12* (2006.01)

(52) U.S. Cl.
CPC ........... *G01R 31/14* (2013.01); *G01R 31/1209* (2013.01); *H04S 2400/11* (2013.01)

(58) Field of Classification Search
CPC ... G01R 31/14; G01R 31/1209; H04S 2400/11
(Continued)

(56) References Cited

U.S. PATENT DOCUMENTS 1,943,391 A    1/1934 Paine et al.
1,943,392 A    1/1934 Paine et al.
(Continued)

FOREIGN PATENT DOCUMENTS

WO    WO 99/09422    2/1999

OTHER PUBLICATIONS

Renno, Marco Antonio Martins, "Using Acoustic Emissions for Corona Detection," Advances in Power and Energy Systems, Proceedings of the 12th WSEAS International Conference on Electric Power Systems, High Voltages, Electric Machines (POWER'12), Sep. 24-26, 2012, pp. 116-121 (ISBN: 978-1-61804-128-9).

*Primary Examiner* — Vivian Chin
*Assistant Examiner* — Ammar Hamid
(74) *Attorney, Agent, or Firm* — Dickinson Wright PLLC

(57) ABSTRACT

Apparatuses, systems and methods for detecting corona using audio data are disclosed. A method of processing audio data to detect corona includes determining an indicator of energy at a substantially fundamental frequency in the audio data, determining an indicator of the energy at a plurality of harmonic frequencies in the audio data, determining an indicator of the noise energy in the audio data, determining a comparison indicator of the noise energy relative to the energy at the harmonic frequencies, determining a masking indicator having thresholds for each of the harmonics relative to the fundamental frequency, and determining a corona detection indicator. An apparatus for detecting corona includes a memory, an audio detector configured to obtain the audio data near an electrical conductor in an AC system, and a processor to process the audio data, fundamental and harmonic frequencies of the audio data and their corresponding thresholds to detect corona.

25 Claims, 11 Drawing Sheets

(58) Field of Classification Search
USPC ............... 381/58, 56; 324/72, 536; 455/282
See application file for complete search history.

(56) References Cited

U.S. PATENT DOCUMENTS

| | | | |
|---|---|---|---|
| 3,253,457 A | 5/1966 | Pakala et al. | |
| 3,505,597 A | 4/1970 | Cronin et al. | |
| 3,612,992 A | 10/1971 | Cronin et al. | |
| 3,728,619 A | 4/1973 | Harrold et al. | |
| 3,867,712 A | 2/1975 | Harthill et al. | |
| 4,006,410 A | 2/1977 | Roberts | |
| 4,095,173 A | 6/1978 | Darrel | |
| 4,245,187 A | 1/1981 | Wagner et al. | |
| 5,986,276 A | 11/1999 | Labriola, II | |
| 6,247,353 B1 | 6/2001 | Battenberg et al. | |
| 6,476,396 B1 * | 11/2002 | Forsyth | G01J 1/42 250/372 |
| 6,507,181 B1 | 1/2003 | Pakonen et al. | |
| 6,545,485 B1 * | 4/2003 | Sanderson | G01R 31/088 324/520 |
| 7,010,445 B2 | 3/2006 | Battenberg et al. | |
| 7,183,774 B2 * | 2/2007 | Kuppuswamy | G01R 31/1254 324/536 |
| 7,430,932 B2 | 10/2008 | Mekhanoshin et al. | |
| 7,627,400 B2 | 12/2009 | Dutoya et al. | |
| 7,891,060 B2 | 2/2011 | Ross et al. | |
| 7,912,660 B2 * | 3/2011 | Anderson | G01R 31/1227 340/636.17 |
| 8,475,219 B2 | 7/2013 | Crutcher et al. | |
| 2003/0209077 A1 | 11/2003 | Battenberg et al. | |
| 2006/0155422 A1 | 7/2006 | Uy et al. | |
| 2006/0209632 A1 | 9/2006 | Goodman et al. | |
| 2009/0180629 A1 * | 7/2009 | Sander | H04M 1/05 381/58 |
| 2009/0210177 A1 | 8/2009 | McCullough et al. | |
| 2009/0312971 A1 | 12/2009 | Lee | |
| 2010/0039271 A1 | 2/2010 | Izikoff et al. | |
| 2011/0023585 A1 | 2/2011 | Izikoff | |

* cited by examiner

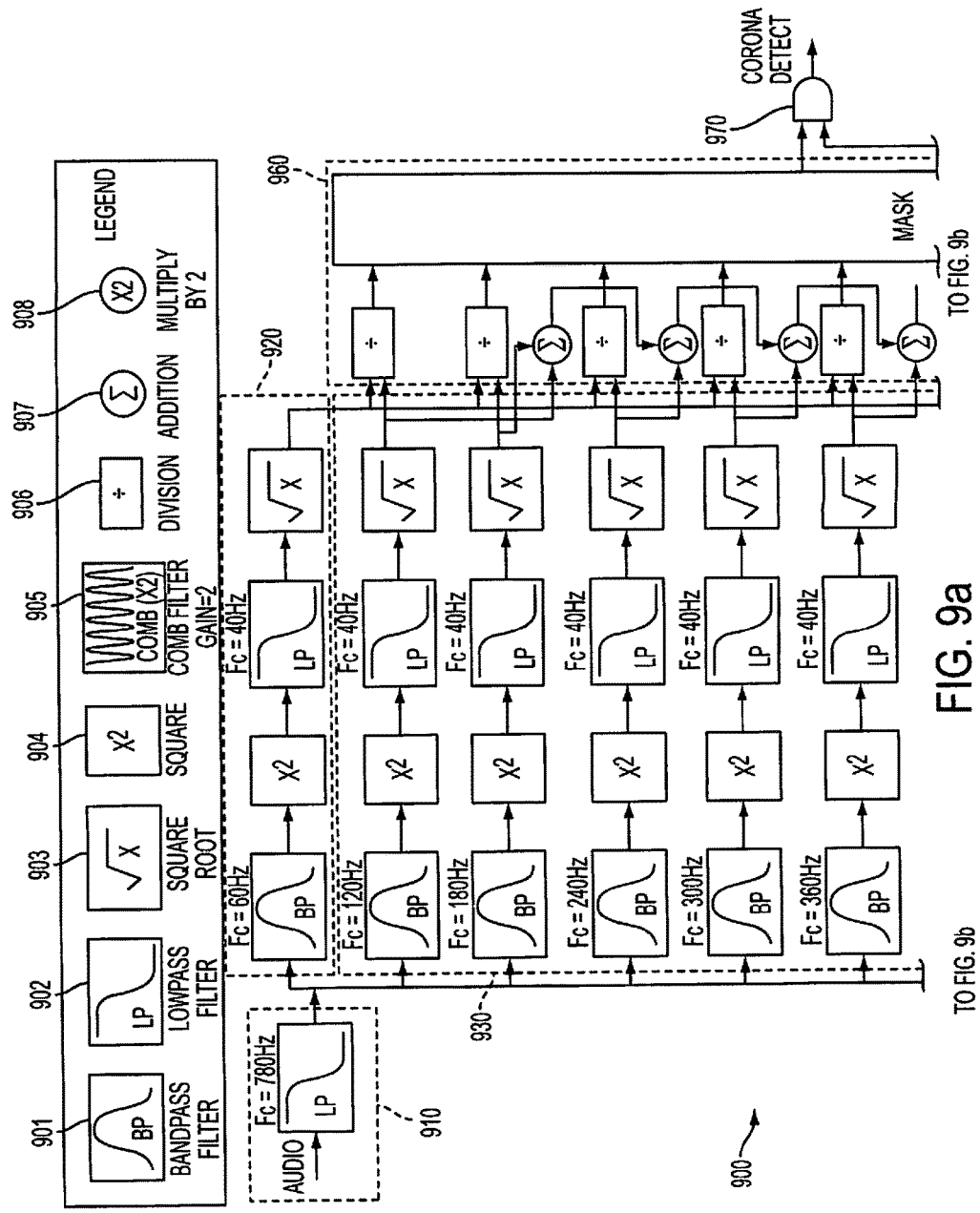

APPARATUSES, SYSTEMS AND METHODS FOR DETECTING CORONA

CROSS REFERENCE TO RELATED APPLICATIONS

This application claims the benefit of U.S. provisional patent application Ser. No. 61/781,496, and is a continuation in part of U.S. national phase application Ser. No. 13/825,451 based on International Application PCT/US2011/001632, filed Sep. 22, 2011, each of which is incorporated herein by reference in its entirety.

FIELD OF THE INVENTION

The present application relates to the detection of corona using audio data. Some illustrative embodiments of the present invention relate to the detection of corona on power transmission lines using audio data.

BACKGROUND OF THE INVENTION

Power Grids

FIGS. 1-4 illustrate related art disclosed in U.S. Pat. No. 8,002,592. FIG. 1 shows a transmission tower 200 which is used to suspend power transmission lines 202 above the ground. The tower 200 has cantilevered arms 204. Insulators 206 extend down from the arms 204. One or more suspension clamps 208 are located at the bottom ends of the insulators 206. The lines 202 are connected to the suspension clamps. The clamps 208 hold the power transmission lines 202 onto the insulator 206.

FIGS. 2-4 illustrate an example of a suspension clamp 208, which generally comprises an upper section 210 and a lower support section 212. These two sections 210, 212 each contain a body 214, 216 which form a suspension case. The bodies 214, 216 each comprise a longitudinal trough (or conductor receiving area) 215, 217 that allow the transmission conductor 202 to be securely seated within the two sections when the two sections are bolted (or fastened) together by threaded fasteners 201 (not shown). This encases the transmission conductor 202 between the two bodies to securely contain the transmission conductor 202 on the clamp 208. Threaded fasteners are not required and any other suitable fastening configuration may be provided.

The two bodies 214, 216 connected together are suspended via a metal bracket 218 that attaches to the lower body 216 at points via bolt hardware 220.

The lower body, or lower body section, 216 comprise a first end 219 and a second end 221. The conductor receiving area (or conductor contact surface) 217 extends from the first end 219 to the second end 221 along a top side of the lower body 216. The conductor receiving area, including longitudinal trough 217, forms a lower groove portion for contacting a lower half of the conductor 202. A general groove shape is not required, and any suitable configuration may be provided.

In one implementation, the upper and lower sections 210, 212 each have embedded within their respective bodies 214, 216 one-half of a current transformer 222, 224 that is commonly referred to in the industry as a split core current transformer. When these components 222, 224 are joined, they form an electromagnetic circuit that allows, in some applications, the sensing of current passing through the conductor 202. In one implementation, the current transformer is used for power sensing, data collection, data analysis and data formatting devices. In some implementations the current transformer may be located outside of the clamp or similar device or, in some implementations, power may be provided by another means.

The body 214 of the upper section 210 contains a first member 232 and a second member 234 forming a cover plate. The first member 232 comprises a first end 233, a second end 235, and a middle section 237 between the first end 233 and the second end 235. The conductor receiving area (or conductor contact surface) 215 extends from the first end 233 to the second end 235 along a bottom side of the first member 232. The conductor receiving area 215 forms an upper groove portion for contacting an upper half of the conductor 202. A general groove shape is not required, and any suitable configuration may be provided. In one implementation, the first member 232 further comprises a recessed cavity 226 at the middle section 237 that effectively contains an electronic circuit 228. In this implementation, the electronic circuit 228 is designed to accept inputs from several sensing components. This cavity 226 may be surrounded by a faraday cage 230 to effectively nullify the effects of high voltage EMF influence from the conductor 202 on the circuitry 228. The faraday cage may also surround the current transformer 222. The cover plate, or cover plate member, 234 can cover the top opening to the cavity 226 to retain the electronic circuit inside the body, or upper body section, 214. The electronics may be housed in a metal or plastic container, surrounded by the noted faraday cage, and the entire assembly can be potted, such as with epoxy for example.

The electronic circuit 228 can accept and quantify in a meaningful manner various inputs for monitoring various parameters of the conductor 202 and the surrounding environment. The inputs can also be derived from externally mounted electronic referencing devices/components. The inputs can include, for example: Line Current reference (as derived from the Current transformer 222, 224 or other means); Barometric pressure and Temperature references—internal and ambient (as derived from internal and external thermocouples 236, 238 or other means); Vibration references of the conductor (as derived from the accelerometer 240, such as a 0.1-128 Hz sensor, for example, or other means); and Optical references (as derived from the photo transistor 242 in a fiber optic tube or other means). The optical reference portion may, for example, allow the clamp to look up and see flashes of light from corona if the insulator starts to fail, or lightening indication storm activity, and/or tensile references (as derived from the tension strain device 244 which may be included in certain implementations). The tensile references from the tensile indicators 244 may, for example, provide information indicating that ice is forming as the weight of the conductor increases due to ice build up.

Supervisory Control And Data Acquisition (SCADA) generally refers to an industrial control system such as a computer system monitoring and controlling a process. Information derived by the electrical/electronic circuitry can exit the circuit 228 via a non-conductive fiber optic cable 246 and be provided up and over to the transmission tower 200 and ultimately at the base of the tower and fed into the user's SCADA system to allow the end user to access and view electrical and environmental conditions at that sight, or the information can be transmitted to a remote or central site. The suspension clamp or other sensing device may be alternatively configured to wirelessly transmit information from the electronic circuit 228 to a receiver system.

Problems Associated with Corona and Conventional Corona Detection Systems

Corona is a type of electrical discharge which will corrode or eat away at wire, insulators, and anything else in the vicinity. Conventional methods of corona detection involve ultraviolet and ultrasonic detection. Both suffer from a high cost of implementation and various disadvantages. For example, power lines can generate corona that can be seen by using special cameras operating in the ultraviolet spectrum. However, such cameras are large and expensive. The cameras are generally sent to places where an insulator appears to be eaten away, but may not be effective since corona can be intermittent and is affected by many environmental conditions such as moisture and air pressure. Further, conventional ultraviolet detectors require a user to manually operate a device and aim at an area suspected to contain corona. As such, these detectors are cumbersome and not autonomous. Furthermore, conventional ultrasonic detectors employ nondiscriminatory means of detecting corona, seeking any noise in a given ultrasonic frequency range. Thus, these detectors are often not sufficiently accurate.

Repair or Servicing a Transmission Line

Initially, one must locate where a power transmission line is broken. However, power transmission lines can run hundreds of miles between substations, and the only information generally available is that one substation is supplying power and the next one is not receiving the supplied power. Accessibility to power transmission lines may vary. In some cases, the power transmission lines may be accessible by motorized ground vehicles. In other cases, lines may only be accessible by helicopter, wherein a service technician must hang under the helicopter to service or repair a line. Such repairs or maintenance can be very expensive. Accordingly, preventative methods of detecting problems such as corona are needed.

Conventional Communication Protocols

In order to retrieve information about the system, rapid and secure communication is necessary. Radio communication via Ethernet is one option. However, organizing an Ethernet network requires the use of devices known as routers or switches. Each router or switch will look at an Ethernet packet of information and make note of the source address and the destination address as the packet arrives at a port. If the destination is known, the packet is forwarded to only one port which is known to be connected to that destination device. If it is not a known address, it is repeated to all ports except the port where it arrived. When the destination device responds, the source address will appear in a packet on a single port which permit the router or switch to learn where to send the next packet with that particular destination address.

There are specific protocols which optimize the route for delivering a packet and to remove the opportunity for a packet to become repeated in a loop in the network. Some of the more common protocols are Spanning Tree Protocol and Rapid Spanning Tree Protocol. A popular radio protocol for packet-based transmission is Zigbee which is described in standard IEEE 802.15.4., but it is only useful in networks in a small geographic area.

There is a need for accurate, inexpensive, small and easy-to-implement systems and methods for detecting corona. These may allow for fast analysis of any actual or potential repair problems and power optimization capabilities along transmission lines, with lower costs of repair, better preventative maintenance, and faster restore times. A need also exists for a way of collecting and communicating data by a widespread installation of sensing devices such as corona sensors over large geographic areas (such as power line grids).

SUMMARY OF THE INVENTION

Illustrative embodiments of the present invention address at least the above problems and/or disadvantages, and provide at least the advantages described below.

An illustrative method and system for detecting corona can be operable to obtaining audio data by a detector near an electrical conductor; and process the audio data using a fundamental frequency corresponding to the AC power signal in the conductor and a selected number of harmonic frequencies of the audio data by a processor to detect corona indicative of a corona condition, wherein thresholds are designated for each of the harmonic frequencies relative to the fundamental frequency and need to be met to detect a corona condition.

In accordance with one or more of the following aspects of the illustrative embodiments, or different combinations thereof, the method and system for detecting corona can process the audio data by determining a first indicator of the energy at a substantially fundamental frequency in the audio data from an audio detector deployed to detect corona generated by an alternating current (AC) system, determining a second indicator of the energy at a plurality of harmonic frequencies in the audio data, determining a third indicator of noise energy in the audio data, determining a normalized indicator of the energy at each of the harmonic frequencies in the audio data by dividing the energy at each of the harmonic frequencies by the first indicator, and detecting a corona event if:
  the second indicator, which corresponds to the sum of the energy at each of the harmonic frequencies, is greater than the third indicator of the noise energy in the audio data; and
  each normalized indicator of the energy at each of the harmonic frequencies in the audio data is within a range of acceptable levels.

With regard to the method and system for detecting corona the fundamental frequency of the audio data is within an frequency range audible to human beings.

The method and system for detecting corona can also communicate an alert on corona event detection.

BRIEF DESCRIPTION OF THE DRAWINGS

The above and other illustrative features, aspects and advantages of the present invention will become more apparent from the following detailed description of certain illustrative embodiments thereof when taken in conjunction with the accompanying drawings in which.

Throughout the drawings, like reference numerals will be understood to refer to like elements, features and structures.

DETAILED DESCRIPTION OF ILLUSTRATIVE EMBODIMENTS

Figure 1:
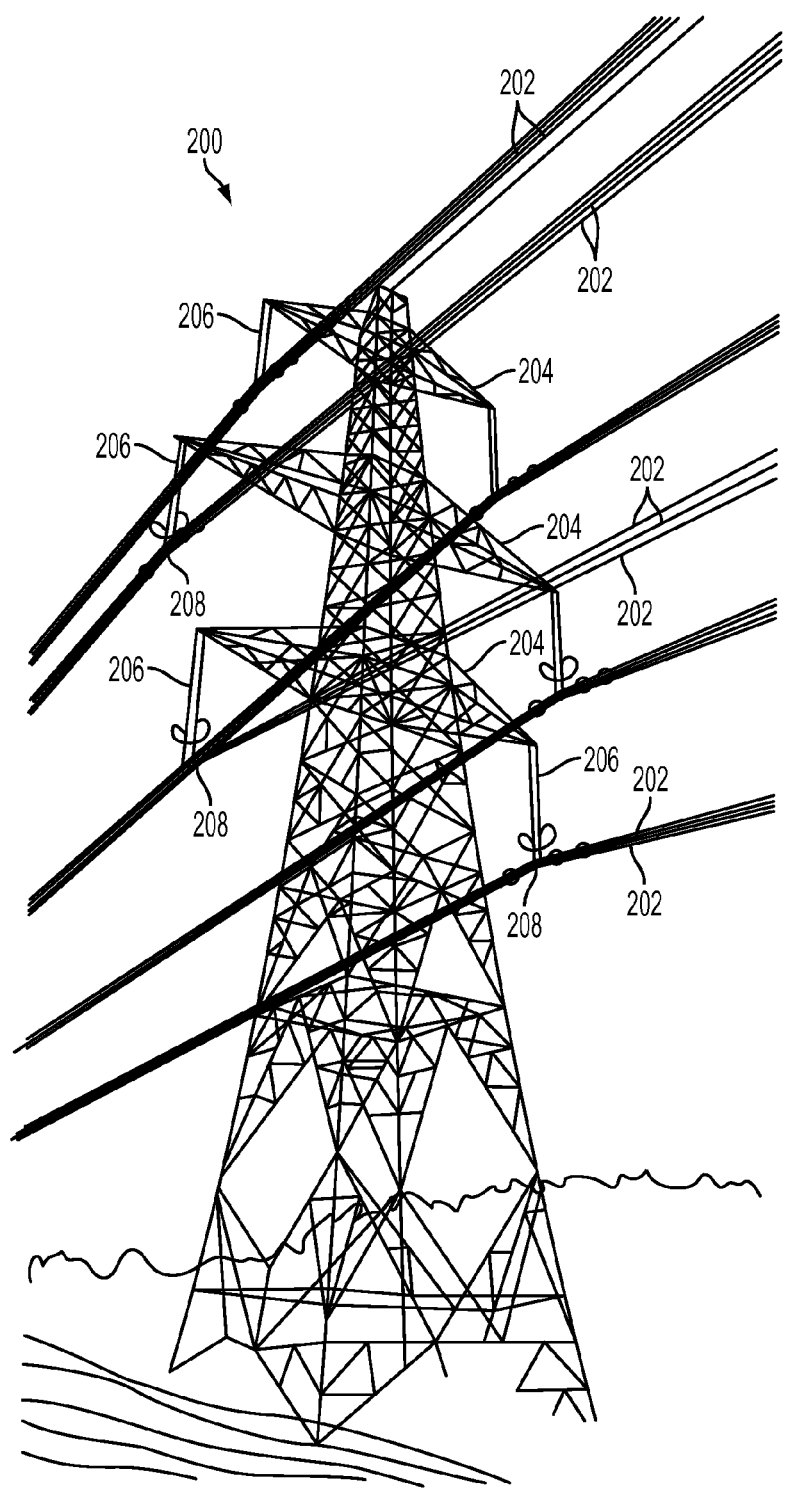
FIG. 1 is a perspective view of a transmission tower supporting transmission lines connected via suspension clamps.

This description is provided to assist with a comprehensive understanding of illustrative embodiments of the present invention described with reference to the accompanying drawing figures. Accordingly, those of ordinary skill in the art will recognize that various changes and modifications of the illustrative embodiments described herein can be made without departing from the scope and spirit of the present invention. Also, descriptions of well-known functions and constructions are omitted for clarity and conciseness. Likewise, certain naming conventions, labels and terms as used in the context of the present disclosure are, as would be understood by skilled artisans, non-limiting and provided only for illustrative purposes to facilitate understanding of certain illustrative implementations of the embodiments of the present invention.

Generally referring to FIGS. 5-9, various apparatuses, systems and methods can detect or assist in the detection of corona according to illustrative embodiments of the present invention. For example, power lines can generate corona that can sometimes be heard in the audio spectrum as a sizzling sound. Briefly, audio data can be collected on site (e.g., a location or installation where corona may be present) using audio sensors in accordance with illustrative embodiments of the present invention. The audio data, including frequency properties of the audio data (e.g., fundamental and harmonic frequencies) can be processed locally and/or remotely with respect to the site. Corona can be detected using the sensed audio data and audio signatures of corona or threshold characteristics, for example. If corona is detected, such detection can be indicative of a corona condition of a conductor, and can be documented using time stamps, durations, and/or other parameters relating to the detected corona event. For example, other parameters can include information about a level of corona detection, frequency of corona detection, or a percentage of time corona is detected over a selected period of time.

An audio spectrum is usually generated along with a corona in or near high power environments, such as, for example, electrical power lines, step-down transformers, high power closets or substations or other power sources for cranes or industrial sites, and neon lamps. While such high power environments are typically associated with voltages of about 12,000 V or more, some illustrative embodiments of the present invention may be applicable to environments associated with any voltage level.

A corona discharge can be created in an alternating current (AC) system at a voltage peak, that is, either at a positive voltage peak or at a negative voltage peak, but generally not both. Consequently, at most one discharge generally occurs per AC cycle. The discharge generally does not persist as the voltage drops. The polarity of the discharge generally depends on the shape of an electrode from which corona originates. Since at most one discharge usually occurs per AC cycle, an AC system generally creates an audio spectrum with a fundamental frequency equal to the frequency of the AC system. For example, a 60 Hz AC system can create an audio spectrum with a fundamental frequency of 60 Hz. It is however possible for corona to be discharged at both positive and negative voltage peaks. It is also possible that some AC cycles create audio spectra with fundamental frequency different from the frequency of the AC system. Accordingly, a fundamental frequency can be arrived at or varied prior, during or after various elements, process(es) or modules employed by the methods or systems according to the present invention. For example, stored corona detection data can be used to determine a desired fundamental frequency.

An audio spectrum can refer to a portion of the audible frequency range at which typical human beings can hear. This range can span, for example, from 20 Hz to 20,000 Hz. An advantage of using audio data over ultrasound data to detect corona is the superior affordability of audio data detectors, such as conventional audio microphones and other audio detectors, over ultrasound detectors.

Another advantage of using audio data over ultraviolet data to detect corona can also be the smaller size, the ease of implementation and the autonomy of systems using conventional microphones and audio detectors, according to some illustrative embodiments of this invention, versus expensive, large, non-autonomous ultraviolet cameras described above.

A further advantage of illustrative embodiments of the present invention disclosed herein is a higher accuracy in the audio spectrum detection of corona than conventional corona detection methods. While conventional methods, such as, for example, methods using ultrasound detection, do not discriminate among different inputs, some illustrative embodiments disclosed herein can seek particular frequency and amplitude patterns in processed audio data. Signal processing of audio data according to illustrative embodiments of the present invention, including, for example, analysis of harmonic frequencies of audio data, results in more accurate detection of corona. As a result of this higher accuracy, corona detection can be more reliably implemented as a preventative measure for preserving the integrity of conductors such as power transmission lines.

A further advantage of illustrative embodiments of the present invention disclosed herein is calibration of evaluation criteria. For example, based on historic data gathered using illustrative embodiments of systems and methods according to the present invention, frequencies or other parameters can be calibrated to provide more accurate corona detection. Further, audio signatures of corona or threshold characteristics can be provided or varied prior, during or after various elements, process(es) or operation(s) or modules employed by the illustrative methods or systems according to the present invention. Stored corona detection data can be used to determine and then calibrate desired audio signatures of corona or threshold characteristics for corona detection purposes (e.g., pre-calibrated data for deployment in a corona detection system).

As described below, illustrative methods or systems according to the present invention look for a specific pattern of harmonic peaks relative to the fundamental in audio data to detect corona, and employ a mask for the expected pattern and a range for the mask. An example frequency mask is described below with reference to FIGS. 6 and 9 (e.g., step 960).

Figure 5:
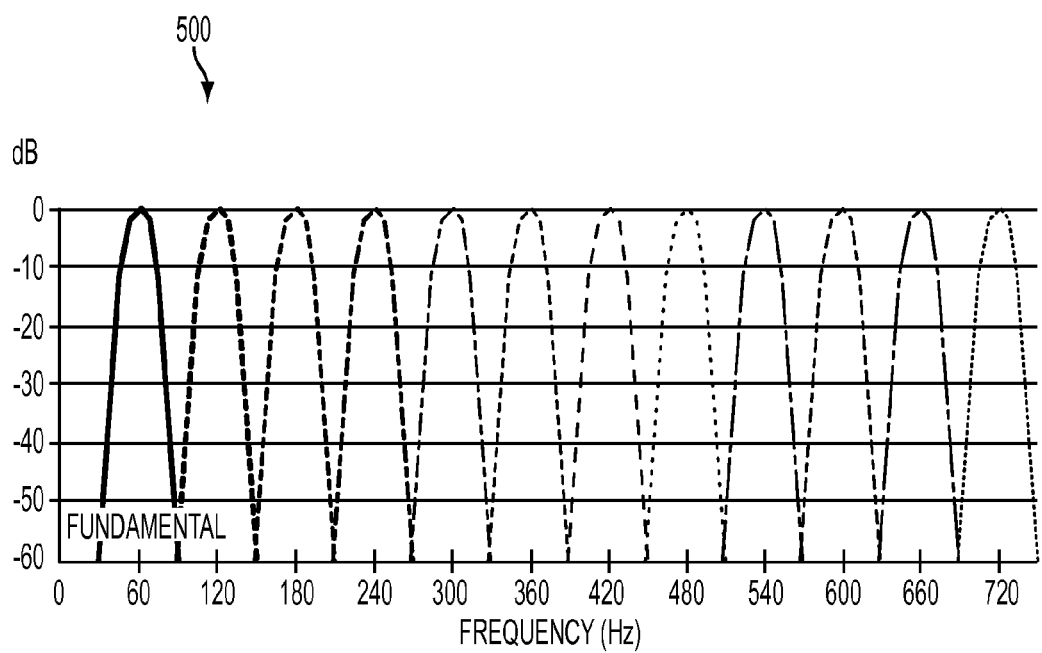
FIG. 5 illustrates a signal-to-noise-ratio versus frequency graph of the frequency responses of an example set of narrowband bandpass filters according to an illustrative embodiment of the present invention.

FIG. 5 illustrates a signal-to-noise-ratio versus frequency graph 500 of the frequency responses of an example set of narrowband bandpass filters. A series of evenly spaced narrow pulses with equal signal-to-noise ratios, from an audio spectrum generated by an AC system, can produce a frequency spectrum with a spike at the fundamental frequency and spikes of equal signal-to-noise ratios at each harmonic. Similar spectra can be detected by applying a set of narrowband bandpass filters with frequency responses as shown in FIG. 5. Digital signal processing can allow for the creation of accurate filters with bands that can be as narrow as required for a given application.

Figure 6:
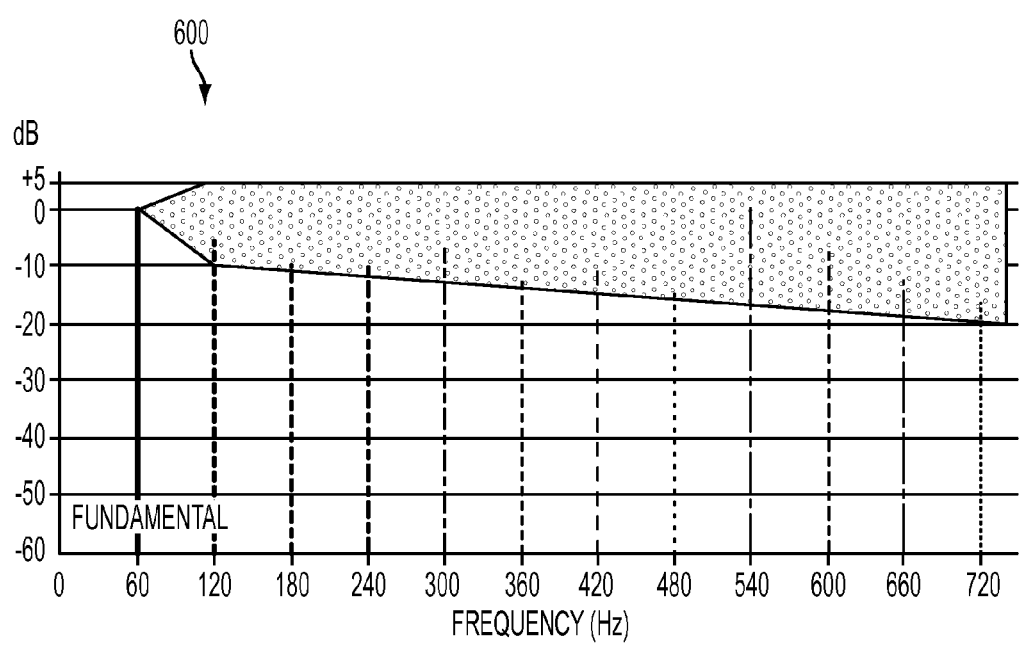
FIG. 6 illustrates a signal-to-noise-ratio versus frequency graph of an example frequency mask for a corona detector according to an illustrative embodiment of the present invention.

FIG. 6 illustrates a signal-to-noise-ratio versus frequency graph 600 of an example frequency mask for a corona detector as employed in accordance with illustrative embodiments of the present invention. The mask assumes the level of each harmonic is about the same, but the higher harmonics are permitted to be more attenuated than the lower order harmonics. In other words, as the widths of pulses from an audio spectrum generated by an AC system increase, the signal-to-noise ratios of the harmonics may decline at higher frequencies. The harmonics at lower frequencies may not be substantially affected by nominal variations in the pulse width. Accordingly, example methods and systems according to illustrative embodiments of the present invention use the fundamental and the next 11 harmonics. Other illustrative implementations of the present invention can use any number of harmonics or frequency range of harmonic frequencies besides an illustrative range of 10-12 harmonics (i.e., that were selected in view of the dynamic range of an illustrative 16-bit converter). While the range of harmonics to be used can range from one to an upper range defined by a range of a detector, it may be preferable to use at least four harmonics. As stated above, when using a mask (e.g., step 960), one may assume the signal-to-noise ratios of the harmonics to be approximately uniform, although harmonics at higher frequencies can be more attenuated than harmonics at lower frequencies without disturbing the process. Alternatively, a number of harmonics can be provided or varied prior, during or after various elements, process(es) or operation(s) or modules employed by the illustrative methods or systems according to the present invention. For example, stored corona detection data can be used to determine and then designate a desired number of harmonics.

A spectrum having harmonics with energies essentially equal to the energy between harmonics is generally insufficient to establish a detection of a corona event, because such a pattern can be produced by background or white noise. Rather, a spectrum having more energy in harmonics than energy between harmonics, or more energy than a multiple of the noise energy between harmonics, is generally a better indicator of corona events. Thus, the illustrative methods or systems according to present invention can use total energy between harmonics to determine corona in the presence of noise and do not require determining energy in respective harmonic frequencies or specific energy between two harmonic frequencies to overcome the effects of noise when detecting corona. The total noise energy between harmonics can be obtained, for example, with a comb filter, as illustrated in FIGS. 7a-b.

Figure 7A:
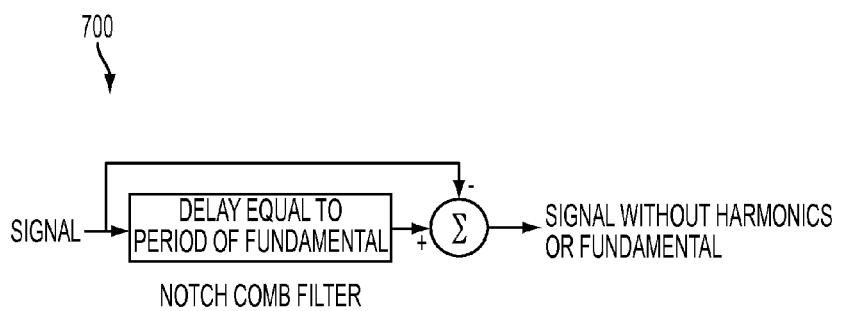
FIG. 7a illustrates a block diagram of the operation of an example comb filter according to an illustrative embodiment of the present invention.
Figure 7B:
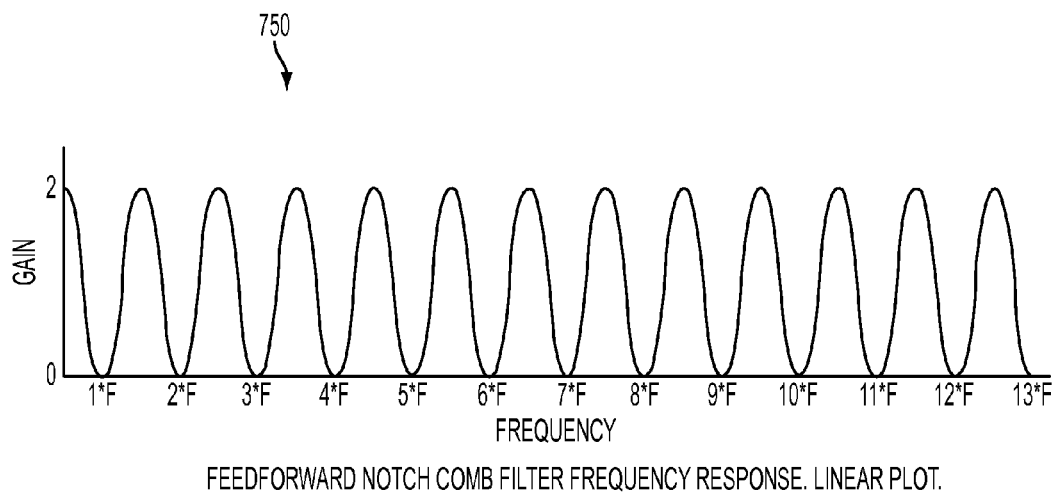
FIG. 7b illustrates a gain-to-frequency graph of the frequency response of an example comb filter according to an illustrative embodiment of the present invention.

FIG. 7a illustrates a block diagram 700 of the operation of an example comb filter according to an illustrative embodiment of the present invention, and FIG. 7b illustrates a gain-to-frequency graph 750 of the frequency response of an example comb filter according to an illustrative embodiment of the present invention. Any comb filter known in the art can be implemented to determine the total noise energy between harmonics in an audio spectrum generated by an AC system. For example, a feedforward notch filter can be implemented with a delay equal to a period of a fundamental frequency of the audio spectrum. By way of example, an illustrative implementation can use a sample rate of 8820 samples per second for a 60 Hz AC system and 7350 samples per second for a 50 Hz AC system. This can result in a 147-sample delay for either frequency. The input data can be subtracted from the delayed data, resulting in a gain at the fundamental and each harmonic. The gain can be 2 between harmonics.

In an example method, the total energy of the harmonics can be compared to the total energy between the harmonics. An example algorithm (e.g., employed by a processor 854) can require the harmonic energy to be at least 4 times higher than the noise energy, such that the gain can be approximately 6 dB. Alternative example algorithms can require the harmonic energy to be greater than any desired multiple of the noise energy. This amount of gain can be adequate to reliably detect most significant corona.

Figure 8A:
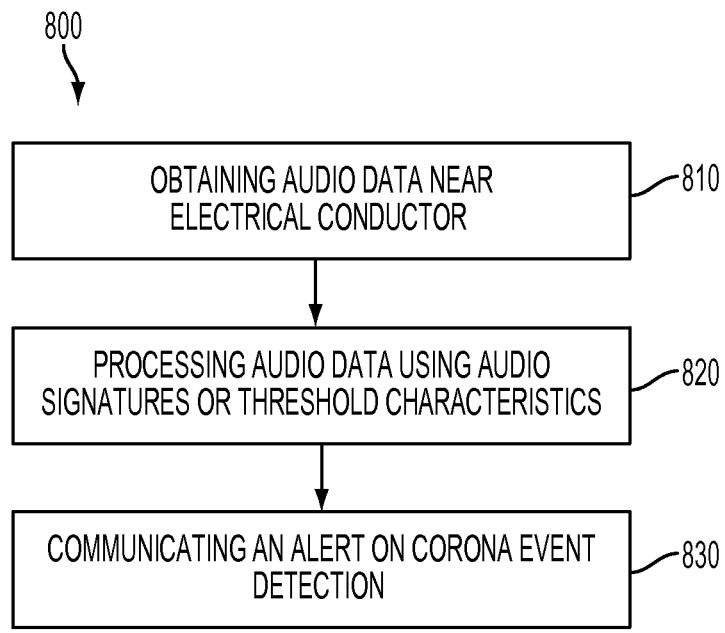
FIG. 8a illustrates an example process for detecting corona using audio data according to an illustrative embodiment of the present invention.

FIG. 8a illustrates a block diagram 800 of a process according to an illustrative embodiment of the present invention for detecting corona using audio data. Briefly, by way of an example, this illustrative method can include obtaining audio data (e.g., near an electrical conductor) at step 810, processing audio data using audio signatures or threshold characteristics at step 820, and communicating an alert on corona event detection at step 830.

Figure 8B:
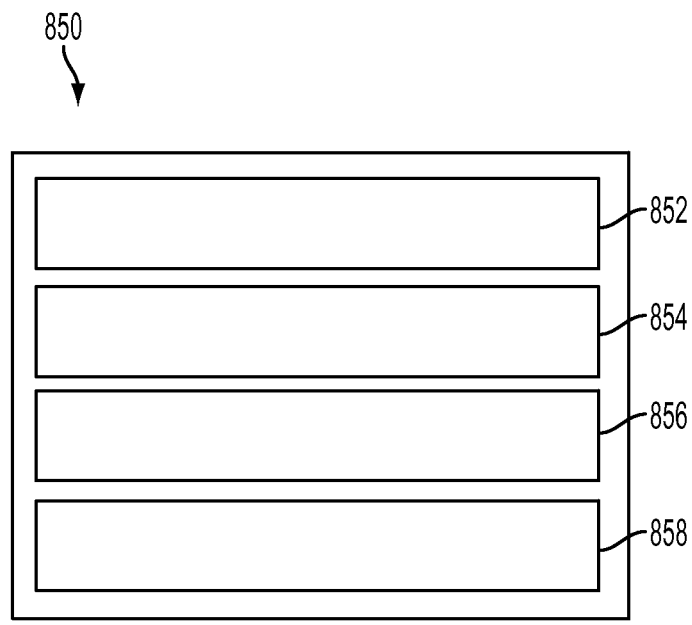
FIG. 8b shows a block diagram of an illustrative apparatus for detecting corona using audio data according to an illustrative embodiment of the present invention.

FIG. 8b shows a block diagram of an illustrative apparatus 850 for detecting corona using audio data according to an illustrative embodiment of the present invention. Apparatus 850 can include audio detector 852, processor 854, memory 856 and communication system 858. Audio detector 852, processor 854, memory 856 and communication system 858 can be electrically or communicatively coupled, can be configured in the same housing or be separate (e.g., the detector 852 and/or the communication system can be separate from the processor 854 and memory 856), and can be configured to perform steps substantially similar to any of the steps in example method 800. Additional illustrative embodiments of the present invention can include components that are enclosed or partially exposed, and can be located in or near a high power environment, on or near a suspension clamp. The apparatus 850 can be connected to a power source available at the site being monitored or can comprise a battery.

At step 810, a detector 852 can obtain audio data, for example, near an electrical conductor, which can be deployed over relatively large geographic distances. The detector 852 can be located near, on or inside a clamp, in a closet, or anywhere with power conductor(s) or other component(s) that are being monitored for corona. Audio data can be obtained using, for example, a microphone, or any other audio data detector known in the art. For example, a conventional microphone can be used, which can be less costly than ultrasonic detectors required by conventional methods of detecting corona.

At step 820, the audio data can be processed using, for example, audio signatures of corona or threshold characteristics. The audio data can be processed using, for example, a digital signal processor (DSP) or any other processor 854 known in the art. The DSP or other processor 854 can be local or remote. Audio signatures of corona or threshold characteristics can be stored or determined, locally or remotely, using a computer, machine-readable media, or other electronic circuitry. Alternatively, audio signatures of corona or threshold characteristics can be provided or varied prior, during or after element(s), process(es) or operation(s) or modules employed by the illustrative methods or systems according to the present invention. For example, stored or collected corona detection data can be used to determine and then calibrate desired audio signatures of corona or threshold characteristics.

The output of the microphone 852 can be continually or periodically sampled by the DSP or other processor 854. The sampled audio data can be processed using the DSP or other processor using audio signatures of corona or threshold characteristics.

At step 830, an alert signal or message can be communicated (e.g., by communication system 858) each time a corona event is detected, for example, or after a particular number of detected corona events has occurred, for example, to assist with calibrating the DSP or other processor 854 to more accurately characterize sounds as corona events. The DSP or other processor can then determine (e.g. using designated audio signatures of corona or threshold characteristics) whether an alert should be generated indicating that a corona event has occurred. The alert signal or message can be communicated using any communication method or systems known in the art, such as, for example, at least one of wired or wireless communication, cell communication, Bluetooth®, ZigBee®, LAN, WLAN, RF, IR, or any other communication method or system known in the art. A communication can be in the form of at least one of an email, a binary code, an e-mail message, an SMS message, a phone communication, a facsimile, or any other form of communication known in the art. Each clamp in a power system can, for example, be configured to send a message (e.g., a short e-mail message) to programmable e-mail addresses in case of events such as current surges, excessive conductor temperature, excessive vibration, corona, and the like to ensure rapid and intelligent response to serious conditions. In an illustrative embodiment of the present invention, a small message containing corona information can be sent, for example, using geographically distributed arrays over long distances. Radio protocols for very large networks can be used to communicate alerts, for example, using methods and systems disclosed in commonly-owned International Application PCT/US2011/001632, filed Sep. 22, 2011. The collected and/or analyzed and/or reported corona event data can include, but is not limited to, time stamps, level, duration, periodicity/patterns, and correlation to coincident temperature, humidity and/or other conditions.

Figure 9B:
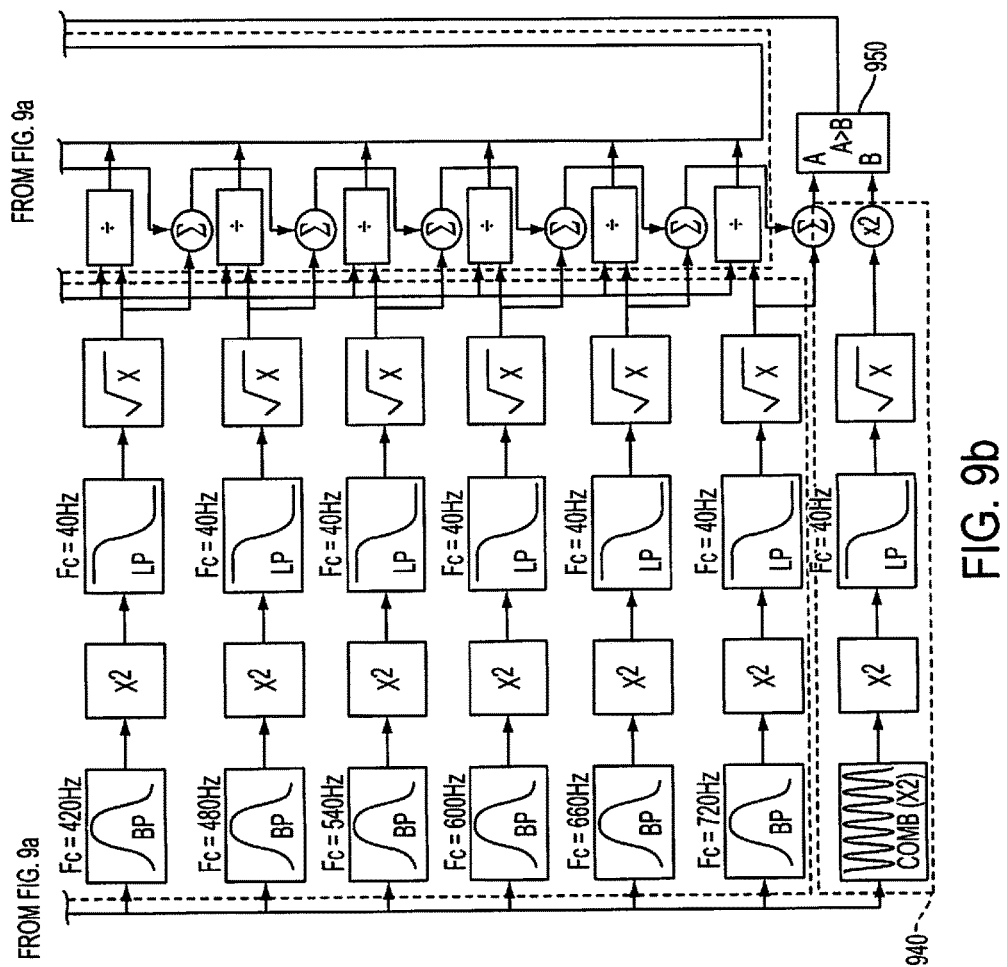
FIG. 9 illustrates a block diagram of an example of a method and a system processing audio data to detect corona according to an illustrative embodiment of the present invention.

FIG. 9 is a block diagram of an example of a method and a system 900 for processing audio data to detect corona according to an illustrative embodiment of the present invention. For example, block diagram 900 shows an example of a system and method for performing step 820 described above. An illustrative method and system 900 for processing audio data can include such elements or modules as a bandpass filter 901, a low-pass filter 902, a square root filter 903, a square filter 904, a comb filter 905, a division 906, an adder 907, and a multiplier 908. Briefly, in an illustrative implementation, a method and system 900 for processing audio data to detect corona can include determining bandwidth limited audio data at step 910, determining an indicator of the energy at a fundamental frequency at step 920, determining an indicator of the energy at each of a plurality of harmonic frequencies at step 930, determining an indicator of the noise energy at step 940, determining a comparison indicator at step 950, determining an example mask or masking indicator at step 960, and determining a corona detection indicator at step 970. It will be understood by a person skilled in the art that some of these steps can be performed in any order.

In an illustrative method and system 900 for processing audio data to detect corona according to an illustrative embodiment of the present invention, a processor 854 with or without memory 856 can perform steps substantially similar to any of steps 910-970 using software, or discrete components (e.g., filters) can be used, or a combination of both. The system and method 900 for processing audio data to detect corona according to illustrative embodiments the invention can be implemented using software and/or hardware components.

In the illustrative implementations, at steps 920, 930 and 940, the root mean square of the energy from each filter (e.g., respective bandpass filters 910 in steps 920 and 930, and comb filter 905 in step 940) is computed by squaring the data 904, performing a low pass filter 902 to get an average, and then taking the square root 903. With regard to steps 930 and 960, the results for each harmonic is then normalized to the energy from the fundamental frequency using a division 906 as shown in step 960. The output of each divider 906 provides the energy in each harmonic as a fraction of the energy in the fundamental frequency. An alternative implementation to using the root mean square function is described below.

As stated above, audio data can include, for example, audio data obtained from an audio detector (e.g., a microphone) deployed with respect to an alternating current (AC) system. Audio data from the audio detector can be analog-to-digital converted. In illustrative implementations, at step 910, bandwidth limited audio is provided to a system 900 to reduce the processing requirements. The lower bandwidth signal can be decimated (reduced sampling rate) before sampling. By way of example, an illustrative implementation may reduce the sample rate from 44,100 samples per second to 8820 samples per second ($\frac{1}{5}^{th}$ rate) for a 60 Hz AC system and 7350 samples per second ($\frac{1}{6}^{th}$ rate) for a 50 Hz AC system.

As explained above, the AC system will typically generate significant energy at the fundamental frequency of the audio data and further energy at harmonics. For a power system, its fundamental frequency will usually contain the majority of the energy. As each frequency is analyzed, the root mean square of the energy is computed. As described above, with reference to steps 920, 930 and 960, the energy at each harmonic frequency separated by the bandpass filters is referenced to the energy at the fundamental frequency using a division 906 to normalize the measured energy.

In illustrative implementations, at step 920, the energy of the fundamental frequency is measured and used as a normative reference for other measurements. The bandpass filter 901 isolates energy at fundamental frequency. In a typical AC power system, the fundamental frequency would be 60 Hz in the United States and other countries and 50 Hz in Europe and other countries. The computation in step 920 (e.g. by processor 854) performs a root means square (rms) measurement. The data is squared, integrated, and a square root results in rms measurement. The low pass filter 902 in step 920 is, essentially, an integration. The output of step 920 is the energy at the fundamental frequency. This is used as a reference. That is, the energy of the harmonics is computed relative to the energy in the fundamental.

In illustrative implementations, at step 930, the energy at each harmonic is computed using the root mean square. While the illustrated embodiment in FIG. 9 shows each bandpass filter is a multiple of 60 Hz, the implementation in a 50 Hz system would use bandpass filters which are multiples of 50 Hz. The corner frequency of the 40 Hz low pass filters (e.g., integrators 901 in step 930) would change to 33.3 Hz for a 50 Hz system (i.e., 40 Hz*50/60=33.3 Hz). The output of each harmonics' section within step 930 produces the rms energy at that harmonic.

In illustrative implementations, at step 940, the energy between the bandpass filters implemented in steps 930 and 920 is measured. In the case where the input signal is simply white noise, energy will be detected in all of the bands, which might be erroneously considered a positive indication. By looking at energy between the harmonics, the illustrative implementation of the method and system 900 can determine a noise floor for the corona detection algorithm or system 900 (e.g., performed by processor 854). The energy in the harmonics must be substantially above the noise floor for the corona detection to be created. The implementation uses, for example, a comb filter with notches at the fundamental and all of the designated harmonics. The peak response of the comb filter will occur at (n+0.5)*fundamental frequency. For a 60 Hz fundamental, the peaks will be at 90 Hz, 150 Hz, 210 Hz, and so forth up to 750 Hz. Above 780 Hz there will be little energy due to the 780 Hz bandpass filter in step 910.

In illustrative implementations, at step 950, a comparison indicator is generated. The indicators of the energy at each harmonic frequency detected at step 930 are summed together in step 960 (e.g., using a processor 854 and a memory 856), and this total energy is compared with, for example, double the noise energy. If the sum of the indicators of the energy at each harmonic frequency is greater than the indicator of twice the noise energy, a comparison indicator is set high. If not, the comparison indicator 950 is set low. If the total energy from the harmonics exceeds twice the noise measured between the harmonics, the signal may be considered for creation of a corona event (with further evaluation). If twice the noise energy exceeds the energy in the harmonics, the signal will be disqualified as corona.

In illustrative implementations, at step 960, a masking indicator can be determined. Normalized indicators of the energy at each harmonic frequency can be determined by dividing each indicator of the energy at each harmonic frequency by the indicator of the energy at the fundamental frequency. A mask can be applied to the normalized indicators of the energy at each harmonic frequency, comparing each normalized indicator of the energy at each harmonic frequency with a range of acceptable levels. A range of acceptable levels can be uniform across frequencies or can vary as a function of frequency. For example, a minimum value in a range of acceptable levels can range linearly or nonlinearly from about 15 dB for the lowest harmonic frequency to about 5 dB for the highest harmonic frequency. Any other range of acceptable levels can be used. Alternatively, a range of acceptable levels can be provided or varied prior, during or after operation using methods or systems according to the present invention. For example, stored corona detection data can be used to determine and then calibrate a desired range of acceptable levels.

If all levels are within the mask, the masking indicator 960 can be set high. If not, the masking indicator can be set low. The masking indicator 960 can be, for example, a mask block output.

In illustrative implementations, at step 970, a corona detection indicator can be determined. A corona detection indicator 970 can be, for example, a corona detection bit, which can be output by an AND gate. If both the comparison indicator 950 and the masking indicator 960 are high, the AND gate output can be set high. If not, the AND gate output can be set low.

An alternative illustrative implementation can use absolute value functions in place of square functions at steps 930 and 920. The low-pass filter may need a lower corner frequency, but the square root at step 930 may not be needed. Even with such narrow filters, the output may not be a sine; consequently, the root mean square may be a more accurate method of measuring energy than the filtered absolute value, though the filtered absolute value may be good enough.

In an alternative illustrative method of processing audio data to detect corona, at least some of steps 910-970 can be performed using a processor and a memory, without using some of blocks or modules 901-908 illustrated in FIG. 9. Indicators in steps 910-970 can be variables.

Figure 10A:
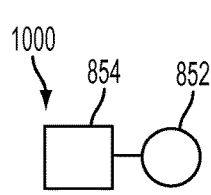
FIGS. 10a-c show illustrative apparatuses for detecting corona using audio data according to illustrative embodiments of the present invention.
Figure 10B:
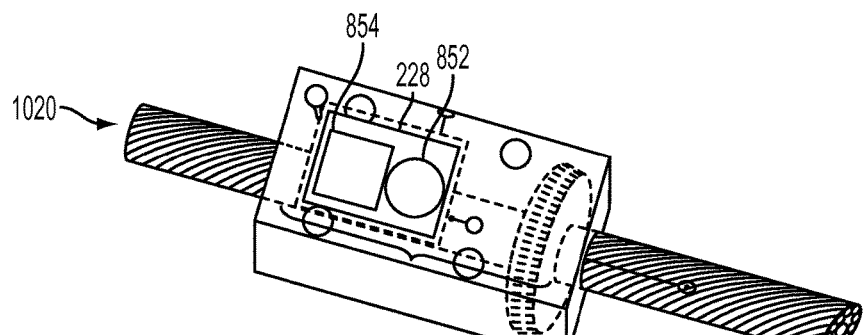
Figure 10C:
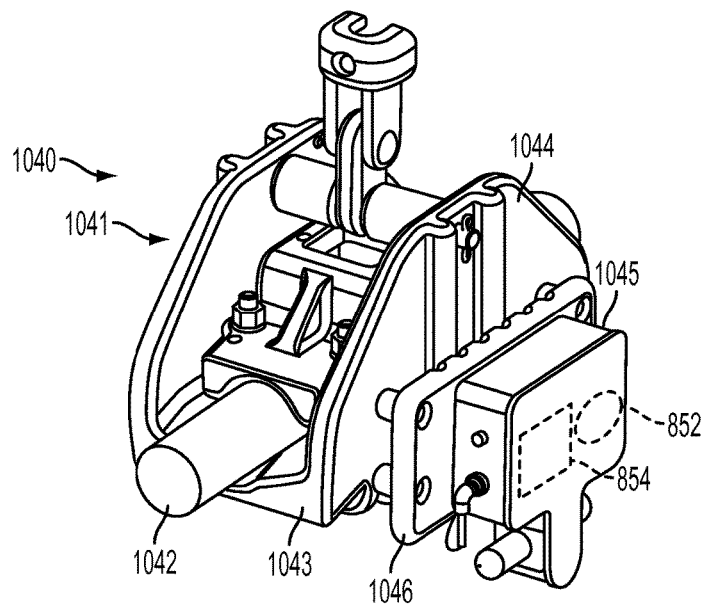

FIGS. 10*a-c* show illustrative apparatuses 1000, 1020 and 1040 for detecting corona using audio data according to illustrative embodiments of the present invention, which can include processor 854 and audio detector 852. Processor 854 and audio detector 852 can be electrically or communicatively coupled, and can be configured to perform steps substantially similar to any of the steps in example method 800.

FIG. 10*a* shows an illustrative stand-alone apparatus 1010 for detecting corona using audio data according to an illustrative embodiment of the present invention, which can include processor 854 having an integral or separate memory 856 and audio detector 852.

Figure 2:
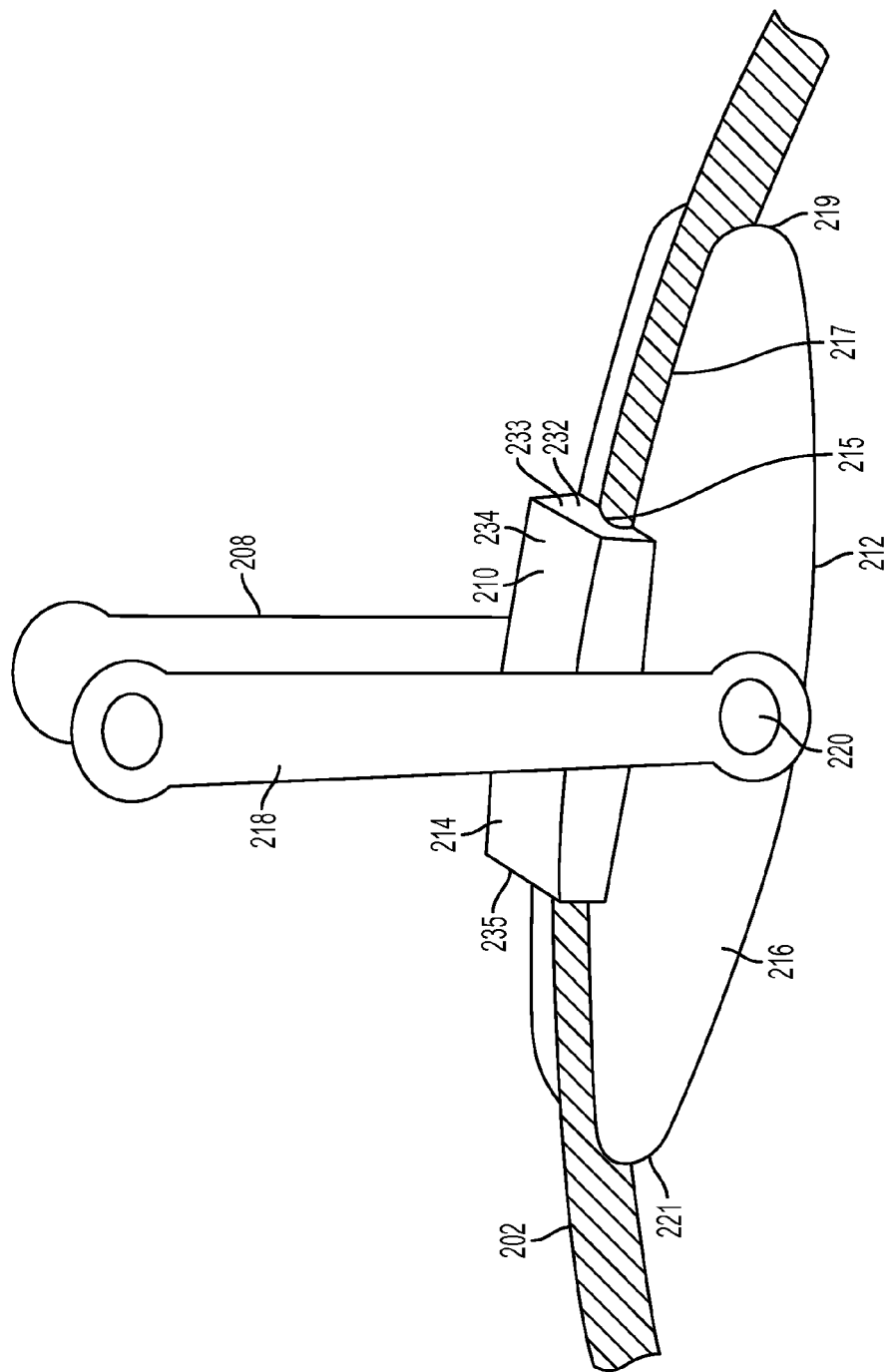
FIG. 2 is a perspective view of a suspension clamp.
Figure 3:
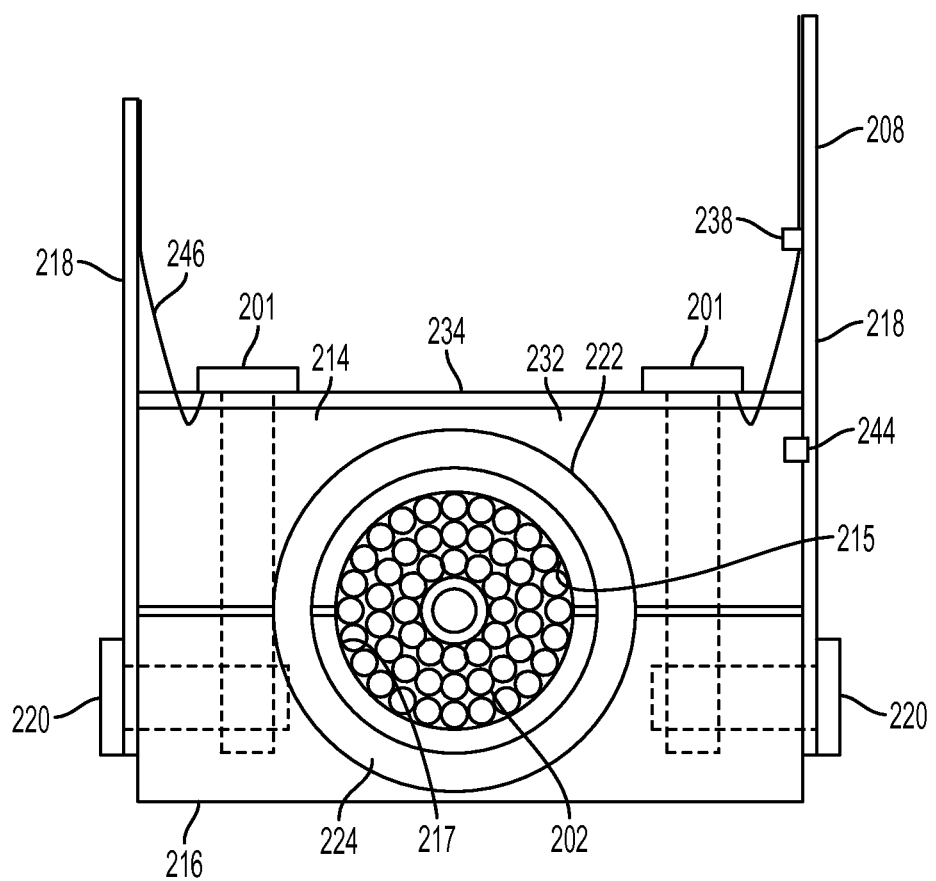
FIG. 3 is a cross section view of the suspension clamp shown in FIG. 2.
Figure 4:
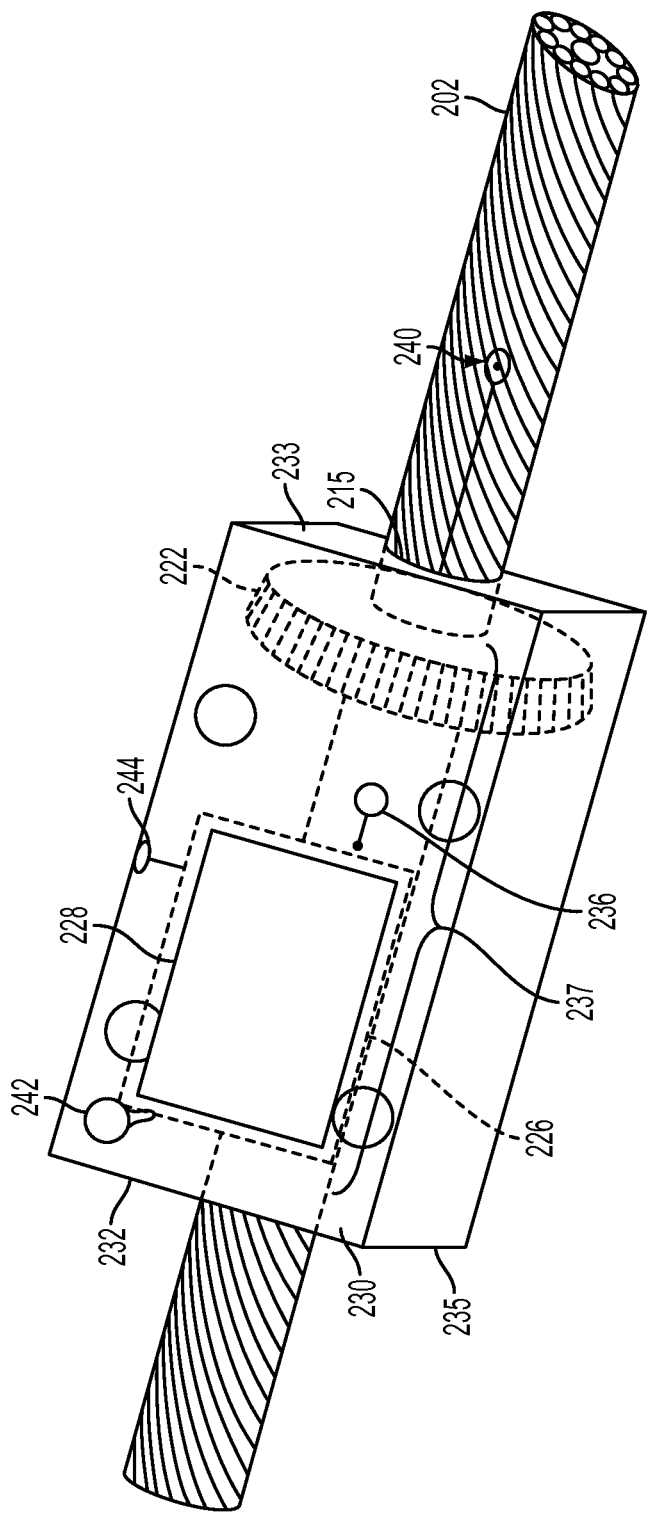
FIG. 4 is a perspective view of a first member of the suspension clamp shown in FIG. 2.

FIG. 10*b* shows an illustrative apparatus 1020 for detecting corona using audio data according to an illustrative embodiment of the present invention, on a suspension clamp substantially similar to the suspension clamp illustrated in FIGS. 2-4 described above. In illustrative apparatus 1020, processor 854 and audio detector 852 can be electrically or communicatively coupled to electronic circuit 228. In an alternative illustrative embodiment of the present invention, electronic circuit 228 can include a processor adapted to perform steps substantially similar to steps that processor 854 is adapted to perform.

FIG. 10*c* shows an illustrative apparatus 1040 for detecting corona using audio data according to an illustrative embodiment of the present invention, on a clamp assembly. The clamp assembly 1041 on a conductor 1042 can include a clamp body 1043, a keeper body 1044 resting on the clamp body 1043, an electronics housing 1045, and a heat shield 1046 that protects the electronic components in the electronics housing 1045. In illustrative apparatus 1040, processor 854 and audio detector 852 can be electrically or communicatively coupled to an electronic circuit disposed within electronics housing 1045.

The components of the illustrative devices, systems and methods employed in accordance with the illustrated embodiments of the present invention can be implemented, at least in part, in digital electronic circuitry, analog electronic circuitry, or in computer hardware, firmware, software, or in combinations of them. These components can be implemented, for example, as a computer program product such as a computer program, program code or computer instructions tangibly embodied in an information carrier, or in a machine-readable storage device, for execution by, or to control the operation of, data processing apparatus such as a programmable processor, a computer, or multiple computers. Examples of the computer-readable recording medium include, but are not limited to, read-only memory (ROM), random-access memory (RAM), CD-ROMs, magnetic tapes, floppy disks, optical data storage devices. It is envisioned that aspects of the present invention can be embodied as carrier waves (such as data transmission through the Internet via wired or wireless transmission paths). A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network. The computer-readable recording medium can also be distributed over network-coupled computer systems so that the computer-readable code is stored and executed in a distributed fashion. Also, functional programs, codes, and code segments for accomplishing the present invention can be easily construed as within the scope of the invention by programmers skilled in the art to which the present invention pertains. Method steps associated with the illustrative embodiments of the present invention can be performed by one or more programmable processors executing a computer program, code or instructions to perform functions (e.g., by operating on input data and/or generating an output). Method steps can also be performed by, and apparatus of the invention can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example, semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

The above-presented description and figures are intended by way of example only and are not intended to limit the present invention in any way except as set forth in the following claims. It is particularly noted that persons skilled in the art can readily combine the various technical aspects of the various elements of the various exemplary embodiments that have been described above in numerous other ways, all of which are considered to be within the scope of the invention.

The above-described illustrative embodiments of an apparatus, system and method can include program instructions, which can be stored on non-transient computer-readable media to implement various operations performed by a processor, such as microprocessor or computer. The media may also include, alone or in combination with the program instructions, data files, data structures, and the like. The media and program instructions may be those specially designed and constructed for the purposes of the present invention, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. The media may also be a transmission medium such as optical or metallic lines, wave guides, and so on, and is envisioned include a carrier wave transmitting signals specifying the program instructions, data structures, and so on. The computer-readable recording medium can also be distributed over network-coupled computer systems so that the computer-readable code is stored and executed in a distributed fashion. Examples of program instructions include both machine code, such as produced by a compiler, and files containing higher level code that may be executed by the computer using an interpreter. The described hardware devices may be configured to act as one or more software modules in order to perform the operations of the above-described embodiments of the present invention.

Although illustrative embodiments of the present invention have been disclosed for illustrative purposes, those skilled in the art will appreciate that various modifications, additions, and substitutions are possible, without departing from the scope of the present invention. Therefore, the present invention is not limited to the above-described embodiments, but is defined by the following claims, along with their full scope of equivalents.

What is claimed is:

1. A method of processing audio data to detect corona comprising: determining a first indicator of an energy at a substantially fundamental frequency in audio data from an audio detector operated in a frequency range from 20 Hertz (Hz) to 20,000 Hz and deployed to detect corona generated by an alternating current (AC) system; determining a second indicator corresponding to the energy at a plurality of harmonic frequencies in the audio data by summing the energy at each of the plurality of harmonic frequencies in the audio data; determining a third indicator of noise energy in the audio data; determining a comparison indicator based on a comparison of the second indicator and the third indicator; determining a masking indicator based on normalized energy at each of the harmonic frequencies; and determining a corona detection indicator based on the comparison indicator and the masking indicator.

2. The method of processing audio data to detect corona of claim 1, wherein the fundamental frequency is a frequency of the alternating current system, and wherein the harmonic frequencies are frequencies that are substantially harmonic to the fundamental frequency.

3. The method of processing audio data to detect corona of claim 1, further comprising: sampling the audio data using a sample rate to determine sampled audio data; and applying a low-pass filter to the sampled audio data.

4. The method of processing audio data to detect corona of claim 3, wherein the sample rate is substantially equal to at least one of: 8820 samples per second for an alternating current system with a frequency substantially equal to 60 Hertz; and 7350 samples per second for an alternating current system with a frequency substantially equal to 50 Hertz.

5. The method of processing audio data to detect corona of claim 1, wherein determining the first indicator of the energy at the substantially fundamental frequency in the audio data comprises: determining bandpass filtered audio data by applying a bandpass filter with a frequency substantially equal to the fundamental frequency to the audio data; and determining the root mean square of the energy in the bandpass filtered audio data.

6. The method of processing audio data to detect corona of claim 1, wherein determining the second indicator comprises: determining bandpass filtered audio data by applying a bandpass filter with a frequency substantially equal to a corresponding one of each of the harmonic frequencies to the audio data; and determining the root mean square of the energy in the bandpass filtered audio data at respective ones of the harmonic frequencies.

7. The method of processing audio data to detect corona of claim 1, wherein the harmonic frequencies in the audio data comprise between and including 4 and 15 substantially harmonic frequencies in the audio data.

8. The method of processing audio data to detect corona of claim 1, wherein harmonic frequencies in the audio data comprise successive multiples of the fundamental frequency.

9. The method of processing audio data to detect corona of claim 1, wherein determining the third indicator of the noise energy in the audio data comprises: determining comb filtered audio data by applying a comb filter to the audio data; and applying a multiplier to the comb filtered audio data.

10. The method of processing audio data to detect corona of claim 9, wherein the comb filter has a multiplicative effect of about 2, and wherein the multiplier has a multiplicative effect of about 2.

11. The method of processing audio data to detect corona of claim 1, wherein determining the comparison indicator comprises: setting the comparison indicator high if the second indicator, which corresponds to the sum of the energy at each of the harmonic frequencies, is greater than the third indicator of the noise energy in the audio data; and setting the comparison indicator low if the second indicator is less than the third indicator of the noise energy in the audio data.

12. The method of processing audio data to detect corona of claim 1, wherein determining a masking indicator comprises: determining normalized indicators of the energy at respective ones of the harmonic frequencies in the audio data by dividing the energy at each of the harmonic frequencies by the first indicator; setting the masking indicator high if each of the normalized indicators of the energy at the harmonic frequencies in the audio data is within a range of acceptable levels; and setting the masking indicator low if each of the normalized indicators of the energy at the harmonic frequencies in the audio data is outside the range of acceptable levels.

13. The method of processing audio data to detect corona of claim 12, wherein a minimum value in the range of acceptable levels is about 15 dB for at least one of the normalized indicators of the energy at the lower of the harmonic frequencies in the audio data, and wherein another minimum value in the range of acceptable levels is about 5 dB for one of the normalized indicators of the energy at the higher of the harmonic frequencies in the audio data.

14. The method of processing audio data to detect corona of claim 12, wherein the range of acceptable levels can be uniform across frequencies or vary as a function of frequency.

15. The method of processing audio data to detect corona of claim 1, wherein determining a corona detection indicator comprises: setting an AND gate output high if the comparison indicator is high and the masking indicator is high; setting the AND gate output low if the comparison indicator is low or the masking indicator is low.

16. The method of processing audio data to detect corona of claim 1, wherein the substantially fundamental frequency is within an frequency range audible to human beings.

17. The method of processing audio data to detect corona of claim 1, wherein the audio data is stored on a memory and processed by a processor to detect corona.

18. A method of detecting corona comprising: obtaining audio data by a detector operated in a frequency range from 20 Hertz (Hz) to 20,000 Hz and near an electrical conductor; and processing the audio data using a fundamental frequency corresponding to the AC power signal in the conductor and a selected number of harmonic frequencies of the audio data by a processor to detect corona indicative of a corona condition; wherein processing the audio data comprises determining a first indicator corresponding to the energy at the selected number of harmonic frequencies in the audio data by summing the energy at each of the selected number of harmonic frequencies in the audio data, determining a second indicator of noise energy in the audio data, and determining a comparison indicator based on a comparison of the first indicator and the second indicator; and wherein thresholds are designated for each of the harmonic frequencies relative to the fundamental frequency and need to be met to detect a corona condition.

19. The method of detecting corona of claim 18, further comprising communicating an alert on corona event detection.

20. The method of detecting corona of claim 18, wherein processing the audio data comprises: determining a third indicator of the energy at a substantially fundamental frequency in the audio data from an audio detector deployed to detect corona generated by an alternating current (AC) system; determining a normalized indicator of the energy at each of the harmonic frequencies in the audio data by dividing the energy at each of the harmonic frequencies by the third indicator; and detecting a corona event if: the first indicator, which corresponds to the sum of the energy at each of the harmonic frequencies, is greater than the second indicator of the noise energy in the audio data; and each normalized indicator of the energy at each of the harmonic frequencies in the audio data is within a range of acceptable levels.

21. The method of detecting corona of claim 18, wherein the fundamental frequency of the audio data is within a frequency range audible to human beings.

22. An apparatus for detecting corona comprising: a memory; an audio detector configured to operate in a frequency range from 20 Hertz (Hz) to 20,000 Hz and to obtain audio data near an electrical conductor; and a processor configured to process the audio data using a fundamental frequency corresponding to the AC power signal in the conductor and a selected number of harmonic frequencies of the audio data to detect corona indicative of a corona condition and thresholds designated for each of the harmonic frequencies relative to the fundamental frequency that need to be met to detect a corona condition; wherein the processor is configured to determine a first indicator corresponding to the energy at the selected number of harmonic frequencies in the audio data by summing the energy at each of the selected number of harmonic frequencies in the audio data, and determine a second indicator of noise energy in the audio data, and determine a comparison indicator based on a comparison of the first indicator and the second indicator.

23. The apparatus for detecting corona of claim 22, further comprising a communication system configured to communicate an alert on corona event detection.

24. The apparatus for detecting corona of claim 22, wherein the processor is configured to perform the steps of: determining a third indicator of the energy at a substantially fundamental frequency in the audio data from the audio detector; determining a normalized indicator of the energy at each of the harmonic frequencies in the audio data by dividing the energy at each harmonic frequencies by the third indicator; and detecting a corona event if: the first indicator, which corresponds to the sum of the energy at each of the harmonic frequencies is greater than the second indicator of the noise energy in the audio data; and each normalized indicator of the energy at each of the harmonic frequencies in the audio data is within a range of acceptable levels.

25. The apparatus for detecting corona of claim 22, wherein the fundamental frequency of the audio data is within a frequency range audible to human beings.

* * * * *